United States Patent [19]
Lee

[11] Patent Number: 5,265,062
[45] Date of Patent: Nov. 23, 1993

[54] ROW DECODER CIRCUIT FOR NON-VOLATILE MEMORY DEVICE

[75] Inventor: Woungmoo Lee, Seoul, Rep. of Korea

[73] Assignee: Samsung Electronics Co., Ltd., Rep. of Korea

[21] Appl. No.: 754,967

[22] Filed: Sep. 3, 1991

[30] Foreign Application Priority Data

Dec. 19, 1990 [KR] Rep. of Korea ............... 90-21060

[51] Int. Cl.⁵ .................................................. G11C 7/00
[52] U.S. Cl. ........................... 365/230.01; 365/185; 365/189.01; 365/218; 365/230.06
[58] Field of Search ............... 365/230.01, 230.06, 365/185, 218, 189.01

[56] References Cited

U.S. PATENT DOCUMENTS

| | | |
|---|---|---|
| 4,630,087 | 12/1986 | Momodomi . |
| 4,878,203 | 10/1989 | Arakawa ........................ 365/185 |
| 5,022,001 | 6/1991 | Kowalski et al. ............. 365/218 X |
| 5,088,060 | 2/1992 | Endoh et al. ............. 365/230.01 X |
| 5,132,928 | 7/1992 | Hayashikoshi et al. ... 365/189.01 X |

FOREIGN PATENT DOCUMENTS 0001972  1/1990  Japan .................................. 365/185

OTHER PUBLICATIONS

"Session X: Nonvolatile Memories"; 1984 IEEE International Solid State Circuits Conference; Sanjay Mehrotra, et al.; pp. 852–858.

*Primary Examiner*—Eugene R. LaRoche
*Assistant Examiner*—Son Dinh
*Attorney, Agent, or Firm*—Christie, Parker & Hale

[57] ABSTRACT

A row decoder circuit for a non-volatile memory device is disclosed, and the circuit is for erasing, programming and reading the data from the cell comprising of a selecting transistor and a sensing transistor. The required high voltage is supplied to word lines and sense lines from a single high voltage generating section, and when erasing data, a low voltage is supplied to the word line. A transistor for connecting a sense line is connected to each row, in such a manner that the damage liable to occur to the gate oxide layer should be reduced, thereby improving the life expectancy of the chip, and reducing the area of the chip.

6 Claims, 5 Drawing Sheets

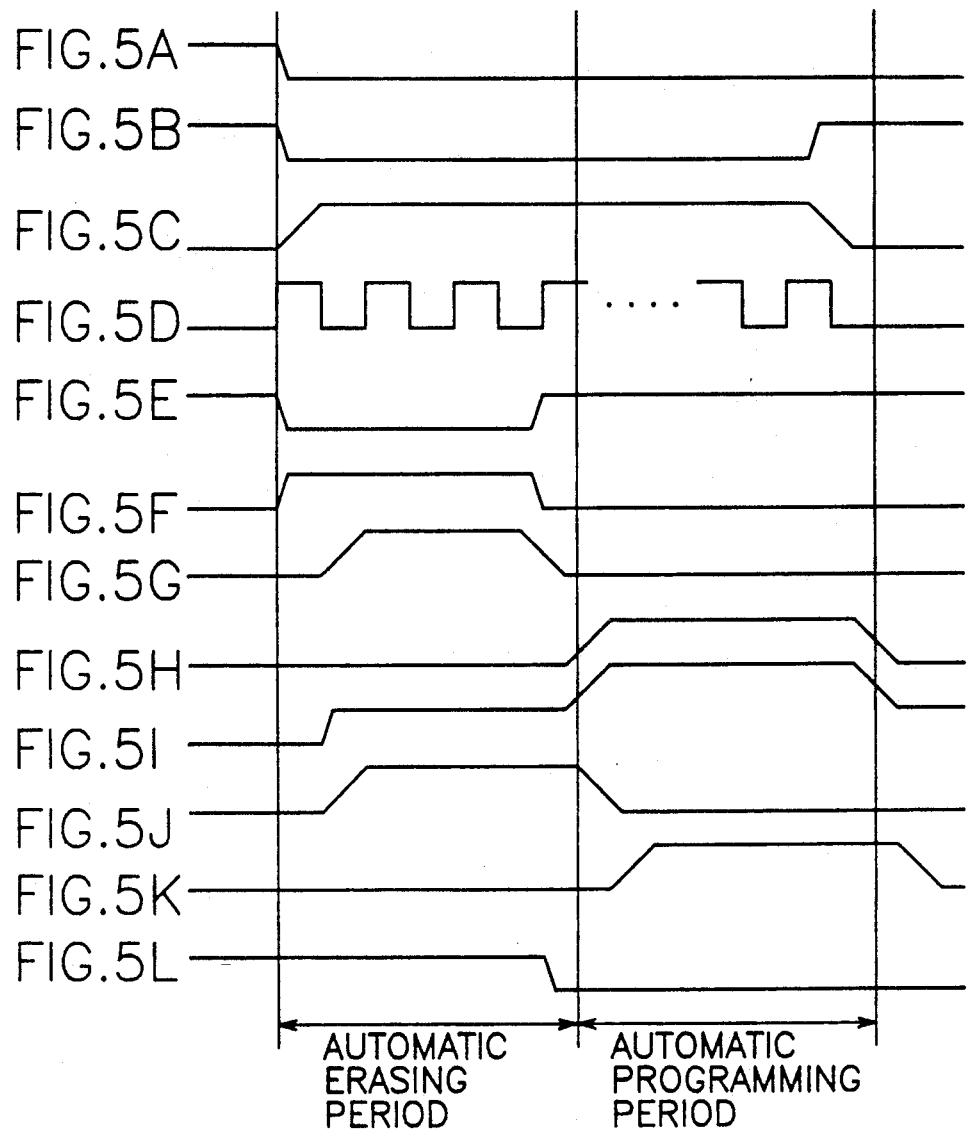

ROW DECODER CIRCUIT FOR NON-VOLATILE MEMORY DEVICE

BACKGROUND OF THE INVENTION (1) Field of the Invention

The present invention relates to a row decoder circuit for a non-volatile memory device, such as an EEPROM, in which data can be rewritten electrically, and particularly to a row decoder circuit for a non-volatile memory device, such as an EEPROM, in which each cell includes a selecting transistor and a sensing transistor, and in which the rewriting of data is possible for each row constituting each page.

(2) Description of the Prior Art Feb. 23, 1984, at pages 852–858

In 1984, SEEQ company published an article in ISSCC about a decoder circuit for a non-volatile memory device in which the rewriting of data is possible in the form of electrically writing and erasing the data in byte units.

As shown in FIG. 6, of the present application this row decoder circuit includes: a row decoder section 1 for selecting a row line, i.e., a word line $WL_1$ by decoding a row selecting signal $A_X$, a column decoder section 2 for selecting a column line $Y_1$ by decoding a column selecting signal $A_X$; a sense line bias section 3 for supplying a bias voltage to a sense line; a row high-voltage supplying section 4 for supplying a high voltage to the selected word line $WL_1$; a column path gate section 5 for passing the column line signals; a column high-voltage supplying section 6 for supplying the high-voltage to the column line; a bit high voltage supplying section 7 for supplying the high voltage to a bit line $BL_1$; and a cell array.

In this conventional row decoder circuit constituted as described above, the erasing of data is carried out in units of byte or row. When a data is to be erased, a high-voltage Vmult is supplied so that the selected word line $WL_1$, and the column line $Y_1$ is kept at the high-voltage Vmult which amounts to about 17V. At the same time, the high-voltage Vmult is supplied to a program line $PL_1$, so that a transistor $M_1$ is turned on, and at the same time, the high voltage is supplied to the gate of a cell $CM_1$.

Under this condition, the voltage of the bit line $BL_1$ is kept at 0 (zero) V, and this zero voltage is supplied through a transistor $M_2$ to the drain of the cell $CM_1$. Further, the high-voltage Vmult of the program line $PL_1$ is supplied through the transistor $M_1$ to a sense line $SL_1$ which is a top gate of the cell $CL_1$. Consequently, electrons are tunnelled from the drain region of the cell $CM_1$ to a floating gate of the cell $CM_1$ for the data to be erased, while the threshold voltage of the cell $CM_1$ is shifted to about 2–5V.

The circuit of FIG. 6 illustrates only one cell as an example. Therefore, in a memory device having 8 input and output terminals, 8 cells are connected to an independent bit line, and a word line is commonly connected to all of the cells. Further, each byte consisting of 8 cells is provided with a byte selecting transistor, and one sense line is commonly connected to 8 cells. Further, one column decoder section 2 is provided for every 8 bit lines, and each cell is allowed to keep independent data through the column path gate section 5.

When programming, that is, when writing data, the selected word line $WL_1$ and the selected column line $Y_1$ are kept at the high-voltage vmult, and the program line $PL_1$ is grounded, so that the sense line $SL_1$ is connected through the transistor $M_1$ to the program line $PL_1$. Further, a bit line $BL_2$ is kept at the high-voltage Vmult, so that a high voltage is supplied to the drain of the cell $CM_1$. Consequently, electrons are tunnelled from the floating gate of the cell $CM_1$ to the diffusing region of the drain, thereby writing the data. Under this condition, the threshold voltage of the program cells $CM_1$ is kept at $-3$ to $-5V$.

Thus, the data of the cells $CM_1$, which are erased and programmed in the manner described above, can be read by detecting the current flowing through the cell $CM_1$, after a reference voltage $V_{REF}$ is supplied through the sense line bias section 3 and the column gate section 5 to the selected sense line, and after a power source $V_{CC}$ is supplied to the selected word line $WL_1$.

However, in the conventional row decoder circuit constituted and operated as described above, each byte requires a byte selecting transistor, so that the size of a chip on which the circuitry is located is enlarged. Further, each time data is programmed or erased, the high-voltage Vmult is supplied to the word line, with the result that the gate oxide layer of the selecting transistor connected to the word line is damaged as the rewriting is repeated, thereby shortening the life expectancy (the duration of the rewriting capability) of the non-volatile memory device.

SUMMARY OF THE INVENTION

It is an object of the present invention to provide a row decoder circuit for a non-volatile memory device, in which a byte selecting transistor is arranged to each row, the voltage for the word lines and the sense lines is supplied from a single high-voltage generating source, thereby reducing the size of the chip.

It is another object of the present invention to provide a row decoder circuit for a non-volatile memory device, in which, when erasing data, the word line is kept at the power source voltage of about 5V, so that the damage liable to occur to the gate oxide layer due to the application of the high voltage can be reduced, thereby extending the life expectancy of the chip.

In order to achieve the above objects, the row decoder circuit according to the present invention is characterized in that: a byte selecting transistor is assigned to each word line; the gate of the byte selecting transistor is connected so as to be controlled by the output of the word line or the row decoder; a node is utilized as a sense line; another node is commonly connected to the program lines so as for it to be connected to the sense line bias section; and the respective word lines and sense lines are connected to the high-voltage gating section in such manner as to supply the high voltage to the word line and the sense line, and thereby reduce the size of the chip.

Furthermore, according to the present invention, the high voltage is supplied to the sense line, not through the program line but directly from the high-voltage generating section, in such a manner that the high voltage should not be supplied to the word line when erasing data. Consequently, when erasing data, the voltage supplied to the word line is the power source voltage $V_{CC}$ of about 5V, thereby inhibiting the damage of the gate oxide layer.

BRIEF DESCRIPTION OF THE DRAWINGS

The above objects and other advantages of the present invention will become more apparent by describing in detail the preferred embodiment of the present invention with reference to the attached drawings in which:

FIGS. 5A to 5L illustrate the wave patterns of the respective sections of FIG. 2 generated during the reading of data by the row decoder circuit.

DESCRIPTION OF THE PREFERRED EMBODIMENT

The preferred embodiment of the row decoder circuit according to the present invention will be described referring to FIGS. 1 to 5.

Figure 1:
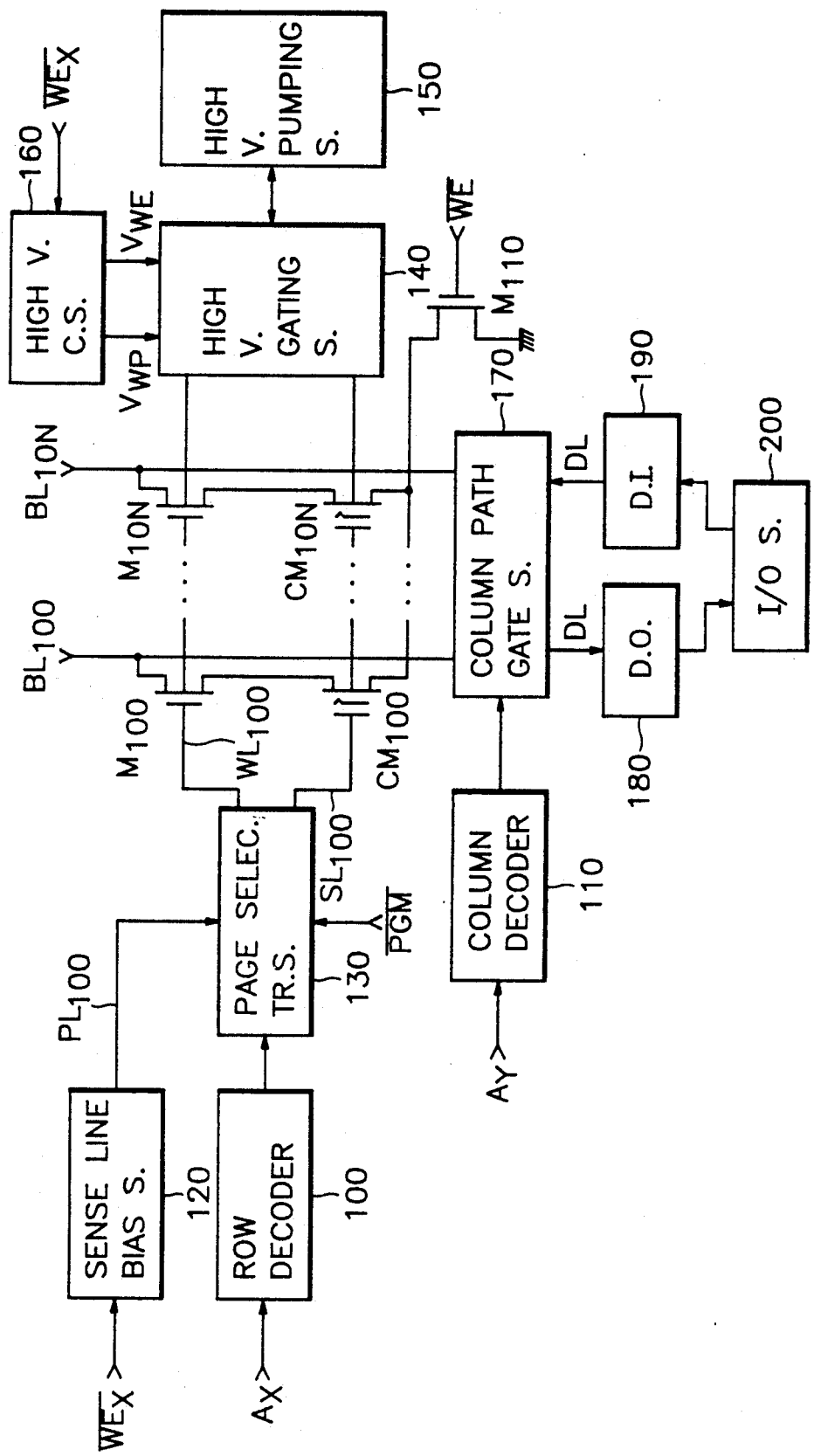
FIG. 1 is a block diagram showing the constitution of the row decoder circuit according to the present invention.
Figure 2:
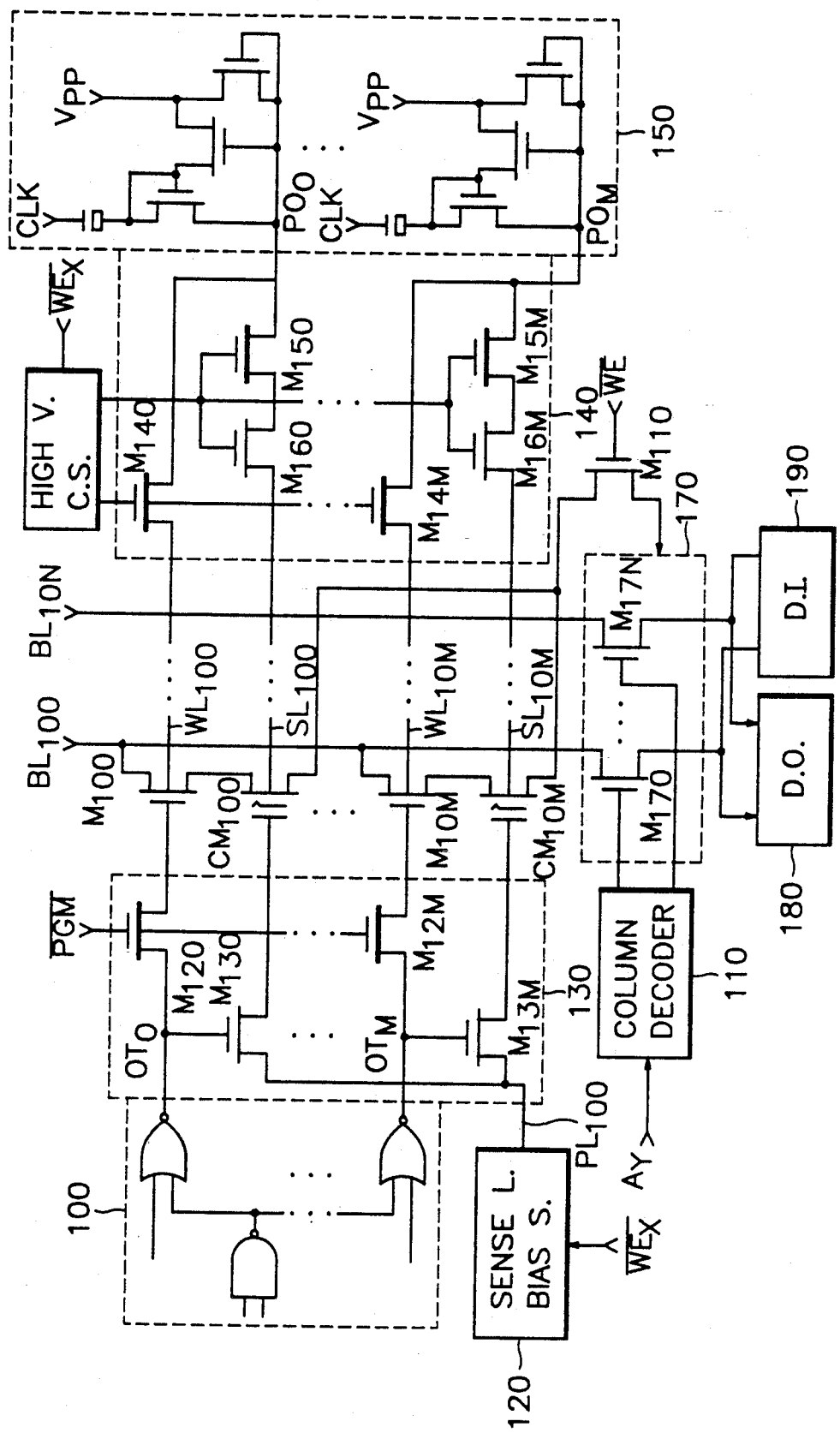
FIG. 2 is a circuit showing an embodiment of the row decoder circuit according to the present invention.
Figure 3:
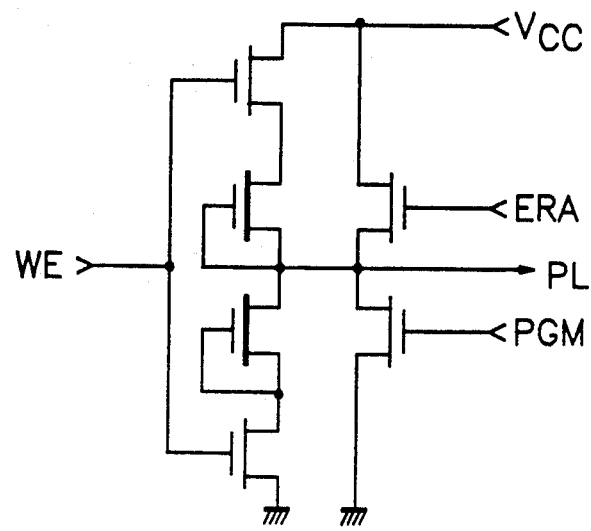
FIG. 3 is a circuit illustrating a sense line decoder section as a part of the decoder circuit of FIG. 2.
Figure 4A:
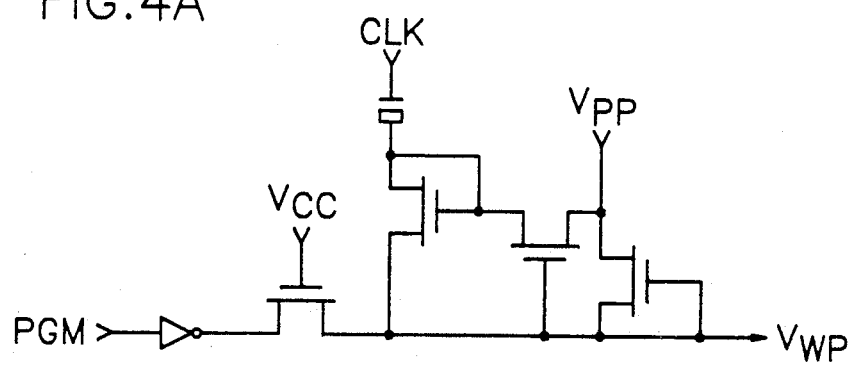
FIGS. 4A and 4B are circuits illustrating the high-voltage control section as a part of the circuit of FIG. 2.
Figure 4B:
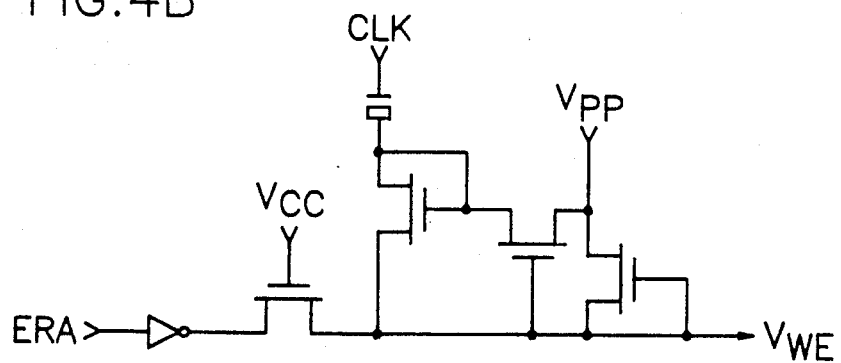
Figure 6:
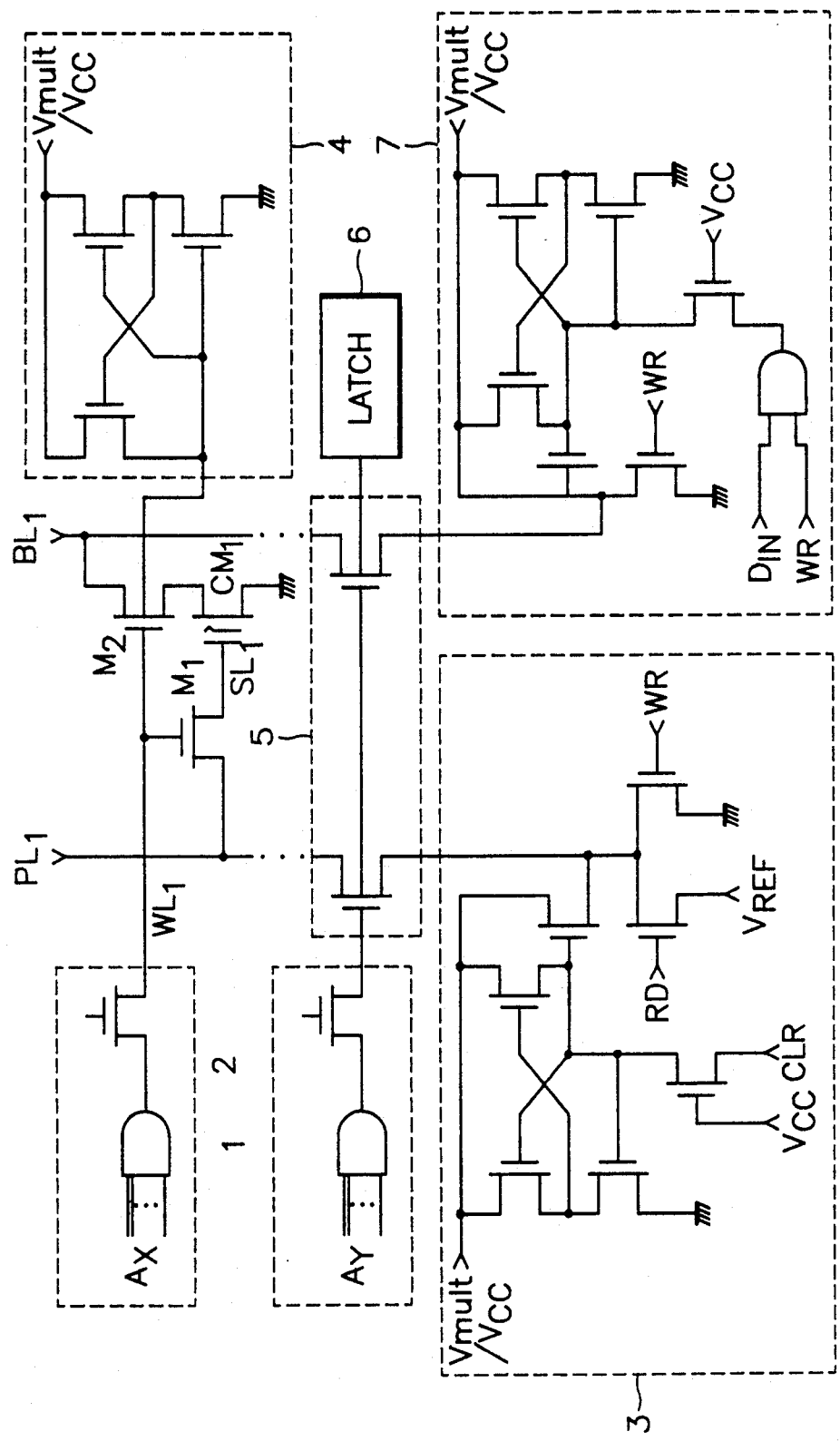
FIG. 6 is a circuit illustrating the conventional row decoder circuit.

FIG. 1 is a block diagram showing the constitution of the row decoder circuit according to the present invention, in which examples of a row line and a plurality of column lines are shown. As shown in this drawing, the row decoder circuit according to the present invention includes:

a row decoder section 100 and a column decoder section 110 for respectively selecting one row line and one column line among a plurality of row lines and a plurality of column lines in accordance with the externally inputted addresses $A_X$, $A_Y$;

a sense line bias section 120 for supplying a predetermined voltage to a program line in accordance with a writing control signal $\overline{WE_X}$ externally inputted;

a page selecting transistor section 130 for supplying an operating voltage to a sense line $SL_{100}$ and a word line $WL_1$ selected in accordance with a program signal $\overline{PGM}$ and an output of the row decoder section 100;

selecting transistors $M_{100}$–$M_{10N}$ disposed at the crossing points between a plurality of bit lines $BL_{100}$–$BL_{10N}$, and a word line $WL_{100}$, for being connected to sense transistors $CM_{100}$–$CM_{10N}$;

sense transistors $CM_{100}$–$CM_{10N}$ disposed at the crossing points between the selecting transistors $M_{100}$–$M_{10N}$ and a sense line $SL_{100}$, for erasing and storing data;

a pull down transistor $M_{110}$ with its drain connected to the sources of the sense transistors $CM_{100}$–$CM_{10N}$, with its source grounded, and with its gate receiving a writing control signal $\overline{WE}$;

a high-voltage gating section 140 for supplying a predetermined high voltage to both the word line $WL_{100}$ and the sense line $SL_{100}$;

a high-voltage pumping section 150 for generating a high voltage and for supplying it to the high-voltage gating section 140;

a high-voltage control section 160 for carrying out controls in accordance with the writing control signals $\overline{WE_X}$ in such a manner that the high-voltage gating section 140 should be able to selectively supply the high voltage to the word line $WL_{100}$ and the sense line $SL_{100}$;

a column path gate section 170 for selecting one of the bit lines $BL_{100}$–$BL_{10N}$ in accordance with the output signal of the column decoder section 110, and for connecting the selected one to a common data line DL;

a data output buffer 180 for connecting the data of the selected cell to an amplifying input/output section 200; and a data input buffer 190 for connecting the data of the input/output section 200 to the column path gate section 170 during the writing of data.

The row decoder circuit according to the present invention constituted as above will now be described in further detail referring to FIGS. 2 to 5 in which a column line and a plurality of row lines are illustrated as an example.

Here, transistors $M_{100}$–$M_{10N}$, $M_{130}$–$M_{13N}$, $M_{160}$–$M_{16N}$ consist of enhancement type NMOS transistors, while transistors $M_{120}$–$M_{12N}$, $M_{140}$–$M_{14N}$, $M_{150}$–$M_{15N}$ consist of depletion type transistors.

If the writing control signal $\overline{WE_1}$ inputted from the outside has a low potential as shown in FIG. 5A, and thus, if the writing of data is recognized into the interior of the chip, then the writing cycle is separated into an automatic erasing period and an automatic programming period within the chip owing to the function of a counter (not shown in the drawing).

If the writing control signal $\overline{WE_1}$ has a low potential, the writing control signal WE is also shifted to a low potential as shown in FIG. 5B, and a high-voltage stepping-up circuit within the chip is activated so that a power source of about 20V should be supplied as shown in FIG. 5C, as well as supplying a clock signal CLK as shown in FIG. 5D.

If an erasing signal $\overline{ERA}$ has a low potential as shown in FIG. 5E during the automatic erasing period, then the sense line bias section 120 outputs a power source voltage of about 5V as shown in FIG. 5F. Further, the high-voltage control section 160 outputs a high potential through an output terminal $V_{NF}$ as shown in FIG. 5G, while a low potential is outputted through an output terminal $V_{NF}$ as shown in FIG. 5H.

Further, the row decoder section 100 outputs a voltage of about 5V through an output terminal $OT_0$ which is selected in accordance with an address signal $A_X$ inputted from the outside, while the row decoder section 100 outputs a low potential through other output terminals $OT_1$–$OT_N$.

Under this condition, a voltage of about 5V is transferred from the output terminal $OT_0$ through the transistor $M_{120}$ to the selected word line $WL_{100}$. This voltage of about 5V is transferred from the word line $WL_{100}$ through the transistor $M_{140}$ to the output terminal $PO_0$ of the high-voltage pumping section 150. Thus, high voltage pumping section 150 steps up the voltage of about 5V to the voltage of a power source $V_{pp}$, i.e., to about 20V in accordance with the clock signal CLK, and then, outputs the stepped-up voltage to the output terminal $PO_0$.

Thus, the high voltage of the power source $V_{PP}$ which is stepped up from about 5V is not transferred to the word line $WL_{100}$ as shown in FIG. 5I because of the low potential of the gate of the transistor $M_{140}$. Rather, the high voltage is transferred to the sense line $SL_{100}$ as shown in FIG. 5I because of the high potential of the gates of the transistors $M_{150}$, $M_{160}$, i.e., because of the activated state of the transistors $M_{150}$, $M_{160}$ which are connected to the sense line $SL_{100}$.

Under this condition, the program line $PL_{100}$ which is connected to the source of the transistor $M_{130}$ as the path of the sense line $SL_{100}$ is kept at a voltage of about 5V, and its gate is also kept at a voltage of about 5V, while the sense line $SL_{100}$ is kept at a high voltage of about 20V so as for it to be in a shunt-off state.

Therefore, the word line $WL_{100}$ which is selected during the erasing of data is caused to have a voltage of about 5V, and the high voltage $V_{PP}$, of about 20V is supplied to only the selected sense line $SL_{100}$, so that electron charges should be tunnelled from the drain of the sense transistor $CM_{100}$ to their floating gate, while the bit line $BL_{100}$ is grounded so that is has a low potential as shown in FIG. 5K.

Meanwhile, the unselected output terminals $OT_1...OT_N$ of the row decoder 100 are kept at zero volts, and therefore, the word lines $WL_{101}-WL_{10N}$ are also at zero volts. Accordingly, zero volts is also supplied through the transistors $M_{151}-M_{15N}$ to the output terminals $PO_1-Po_m$ of the high-voltage generating section 150, with the result that the unselected sense lines $SL_{101}-SL_{10N}$ are grounded through the transistors $M_{151}-M_{15N}$, $M_{161}-M_{16N}$, to zero volts.

Under this condition, the transistors $M_{131}-M_{13N}$ are put to a shunt-off state. Therefore, it becomes possible to erase the data of the sense transistors $CM_{100}-CM_{10N}$ which are disposed on the row line, and which are selected through the above-described operations.

Meanwhile, when carrying out a programming, the programming operation is implemented after the completion of the erasing operation through the function of the counter within the chip. That is, as shown in FIG. 5L, the program signal $\overline{PGM}$ is sent to a low potential, and the erasing signal $\overline{ERA}$ is sent to a high potential, so that the program line $PL_{100}$ should have a low potential. Further, the high potential control section 60 outputs a high voltage of about 20V through the output terminal $V_{NP}$, while zero volts is outputted through the output terminal $V_{NE}$.

When the gate of the transistor $M_{140}$ comes to have a high voltage, the selected word line $WL_{100}$ is also stepped up to a high voltage, and the 5V voltage of the output terminal $OT_0$ and the high voltage of the word line $WL_{100}$ are electrically isolated from each other, because the program signal $\overline{PGM}$ is kept in a low potential.

Further, when the output terminal $V_{NE}$ is shifted to a low voltage, the transistor $M_{160}$ of the sense line $SL_{100}$ which is selected during the data erasing cycle is discharged through the transistor $M_{130}$ to the ground line. A high voltage is supplied to the word line $WL_{100}$ selected in the above-described manner, and the selected sense line $SL_{100}$ is maintained at the ground voltage. Under this condition, the word lines $WL_{101}$, $WL_{10N}$ which are not selected are kept at the ground voltage as when the erasing is done.

If an arbitrary data which is to be programmed is inputted through the input/output section 200, a predetermined voltage is supplied to the selected bit line $BL_{100}-BL_{10N}$ after amplifying the data which is inputted through the data input buffer 190. For example, if the externally inputted data is "1", zero volts is supplied to the bit lines $BL_{100}-BL_{10N}$, while, if the externally inputted data is "0", 20V is supplied to the bit lines. Thus, when the bit lines $BL_{100}-BL_{10N}$ are kept at zero volts, the erasing of the sense transistors $M_{100}-M_{10N}$ is continued, and by supplying 20V to them, electrons are tunnelled from the floating gates of the sense transistors $M_{100}-M_{10N}$ to their drains.

The sense transistors $M_{100}-M_{10N}$ which are erased and programmed in the above-descried manner supply a voltage of about 5V to the selected word lines, and they also supply a voltage of 1-4V to the program line $PL_{100}$. Further, they also supply a voltage of 1-4V through the transistor $M_{130}$ to the selected sense line $SL_1$, so that the data output buffer 180 should be able to read the current flowing through the sense transistors.

According to the present invention as described above, the power source voltage $V_{CC}$ is supplied to the word line during the erasing of data, so that the internal structure of the chip can be improved. Further, one of the sense line transistors $CM_{130}-CM_{13N}$ is assigned to each row, and the high voltage required to the word line and the sense line is supplied from a single high-voltage generating section, with the result that the size of the chip can be reduced. When erasing data, a voltage of about 5V instead of the high voltage $V_{PP}$ is supplied to the word line, so that the damage liable to occur on the gate oxide layer can be prevented, thereby contributing to improving the reliability and the life expectancy of the chip.

Further, according to the row decoder circuit of the present invention, the enhancement type NMOS transistors $M_{100}-M_{10N}$, $M_{130}-M_{13N}$, $M_{160}-M_{16N}$, and the depletion type NMOS transistors $M_{120}-M_{12N}$, $M_{140}-M_{14N}$, $M_{150}-M_{15N}$ are disposed on the respective word lines and the sense lines in such a manner that they should be controlled by control signals. This makes the layout easier, thereby reducing the area of the chip to the minimum. This solves the problem of the layout difficulty which is encountered in the conventional memory devices according as the density of the memory device is increased, and which is encountered in laying out the row decoder section and the high voltage generating section.

What is claimed is:

1. A decoder circuit for a non-volatile memory device, comprising:

a plurality of word lines and a plurality of sense lines parallel disposed;

a plurality of bit lines disposed transversely to said word lines;

selecting transistors disposed at the crossing points of said bit lines and said word lines;

sense transistors disposed at the crossing points of said bit lines and said sense lines; and a plurality of cell arrays formed by connected said selecting transistors and said sense transistors, and further comprising:

first means for selecting one word line from among the plurality of said word lines in accordance with an address signal;

second means for being controlled by a firs externally inputted control signal, and for connecting said first means to the selected word line in response to said first control signal;

fourth means for connecting said sense lines to a third means controlled by a second externally inputted control signal indicating a data writing operation, said data writing operation comprising an erasing period and a programming period;

fifth means for supplying a high voltage;

sixth means for connecting said fifth means to said word lines for supplying the high voltage to the selected word line during the programming period and for supplying a lower voltage relative to the high voltage to the selected word line during the erasing period; and seventh means for connecting said fifth means to said sense lines for supplying the high voltage to a selected sense line during the erasing period, and for connecting the selected sense line with a ground voltage during the programming period.

2. The decoder circuit for a non-volatile memory device as claimed in claim 1, wherein said second means comprises a depletion type NMOS transistor.

3. The decoder circuit for a non-volatile memory device as claimed in claim 2, wherein the gate of said depletion type transistor receives the lower voltage during the programming period, and the high voltage during the erasing period.

4. The decoder circuit for a non-volatile memory device as claimed in claim 1, wherein said fourth means comprises an enhancement type NMOS transistor, whose gate is controlled by the output of said first means.

5. The decoder circuit for a non-volatile memory device as claimed in claim 1, wherein said seventh means comprises a depletion type NMOS transistor and an enhancement type NMOS transistor, and their gates are controlled by the same signal.

6. The decoder circuit as claimed in claim 1, wherein the fifth means comprises one high-voltage source for each row for supplying high voltage selectively to both the selected word line and sense line.

* * * * *